(12) United States Patent
Lavoie et al.

(10) Patent No.: US 11,368,002 B2
(45) Date of Patent: Jun. 21, 2022

(54) UNMANNED AERIAL VEHICLE FOR MONITORING AN ELECTRICAL LINE

(71) Applicant: HYDRO-QUÉBEC, Montréal (CA)

(72) Inventors: Samuel Lavoie, Ste-Julie (CA); Matthieu Montfrond, Montréal (CA); Eric Lavoie, Montréal (CA)

(73) Assignee: HYDRO-QUEBEC, Montreal (CA)

( * ) Notice: Subject to any disclaimer, the term of this patent is extended or adjusted under 35 U.S.C. 154(b) by 321 days.

(21) Appl. No.: 16/347,835

(22) PCT Filed: Nov. 21, 2017

(86) PCT No.: PCT/CA2017/051385
§ 371 (c)(1),
(2) Date: May 7, 2019

(87) PCT Pub. No.: WO2018/094514
PCT Pub. Date: May 31, 2018

(65) Prior Publication Data
US 2019/0260191 A1    Aug. 22, 2019

Related U.S. Application Data

(60) Provisional application No. 62/425,235, filed on Nov. 22, 2016.

(51) Int. Cl.
*H02G 1/02* (2006.01)
*B64C 39/02* (2006.01)
*G01R 31/58* (2020.01)

(52) U.S. Cl.
CPC ............... *H02G 1/02* (2013.01); *B64C 39/02* (2013.01); *B64C 2201/12* (2013.01); *G01R 31/58* (2020.01)

(58) Field of Classification Search
CPC ........ H02G 1/02; B64C 39/02; B64C 39/024; B64C 2201/12; B64C 2201/126; B64C 2201/027; G01R 31/58; H04B 3/46
See application file for complete search history.

(56) References Cited

U.S. PATENT DOCUMENTS

| | | | |
|---|---|---|---|
| 6,879,163 B2 | 4/2005 | Ormin | |
| 8,060,270 B2 | 11/2011 | Vian et al. | |
| 8,505,461 B2* | 8/2013 | Phillips | H02G 1/02 104/87 |
| 8,666,553 B2* | 3/2014 | Phillips | H02G 1/02 700/259 |
| 8,991,273 B2 | 3/2015 | Phillips et al. | |

(Continued)

FOREIGN PATENT DOCUMENTS

| | | |
|---|---|---|
| CA | 3044139 C | 5/2018 |
| CN | 101574983 A | 11/2009 |

(Continued)

OTHER PUBLICATIONS http://inspectionsweden.se/ROBHOT/default_eng.html.

(Continued)

*Primary Examiner* — Benjamin P Lee
(74) *Attorney, Agent, or Firm* — Norton Rose Fulbright Canada LLP

(57) ABSTRACT

An unmanned aerial vehicle mountable to an aerial conductor of an electricity transmission line to monitor a component. The unmanned aerial vehicle has a body having a propulsion system to lift, lower, and navigate the vehicle. A component monitoring tool is mounted to the body and is vertically displaceable between a first position and a second position. The tool in the first position is vertically spaced from the component. The tool in the second position is engaged with the component. A displacement assembly is mounted to at least one of the body and the tool and includes at least one displacement member to displace the body and the tool along the conductor.

20 Claims, 4 Drawing Sheets

(56) References Cited

U.S. PATENT DOCUMENTS

| | | | |
|---|---|---|---|
| 9,753,461 | B1 | 9/2017 | Johnson et al. |
| 10,613,429 | B1* | 4/2020 | Wingo .................. G01N 23/00 |
| 10,899,475 | B1* | 1/2021 | Freeman, Jr. ......... B64C 39/024 |
| 2006/0114122 | A1* | 6/2006 | Jones ...................... H02G 1/02 340/870.07 |
| 2008/0276823 | A1 | 11/2008 | Montambault et al. |
| 2011/0196536 | A1 | 8/2011 | Phillips et al. |
| 2012/0055766 | A1 | 3/2012 | Greer et al. |
| 2015/0204480 | A1 | 7/2015 | Lorimer et al. |
| 2015/0115927 | A1 | 8/2015 | Vinogradova et al. |
| 2016/0023761 | A1* | 1/2016 | McNally ................. H02G 1/02 29/407.01 |
| 2017/0012413 | A1 | 1/2017 | Barbosa et al. |
| 2017/0168107 | A1 | 6/2017 | Vinogradova et al. |
| 2018/0120196 | A1* | 5/2018 | Georgeson ............. B64D 1/02 |
| 2018/0157251 | A1 | 6/2018 | Cole et al. |
| 2018/0158232 | A1 | 6/2018 | Cole et al. |
| 2018/0205207 | A1 | 7/2018 | Lagosz-Sinclair et al. |
| 2018/0329417 | A1 | 11/2018 | Abuhasira et al. |
| 2019/0159444 | A1 | 5/2019 | Schwartz et al. |
| 2019/0176984 | A1* | 6/2019 | Wabnegger ............. H02G 1/02 |
| 2019/0280467 | A1 | 9/2019 | Hall et al. |
| 2019/0286119 | A1 | 9/2019 | Cole et al. |
| 2019/0286146 | A1 | 9/2019 | Cole et al. |
| 2019/0287688 | A1 | 9/2019 | Cole et al. |
| 2019/0325668 | A1 | 10/2019 | Cole et al. |
| 2019/0382111 | A1 | 12/2019 | Schwartz et al. |
| 2020/0041560 | A1 | 2/2020 | Schwartz et al. |
| 2020/0317336 | A1 | 10/2020 | Beiro et al. |
| 2020/0325977 | A1 | 10/2020 | Greer et al. |
| 2021/0024212 | A1* | 1/2021 | Andeweg ............. B64C 39/024 |

FOREIGN PATENT DOCUMENTS

| | | |
|---|---|---|
| CN | 202632111 U | 12/2012 |
| CN | 202632112 U | 12/2012 |
| CN | 102879692 A | 1/2013 |
| CN | 102891453 A | 1/2013 |
| CN | 102929288 A | 2/2013 |
| CN | 202815124 U | 3/2013 |
| CN | 202817597 U | 3/2013 |
| CN | 202817605 U | 3/2013 |
| CN | 103010070 A | 4/2013 |
| CN | 202896375 U | 4/2013 |
| CN | 103078673 A | 5/2013 |
| CN | 103163881 A | 6/2013 |
| CN | 103224026 A | 7/2013 |
| CN | 203039688 U | 7/2013 |
| CN | 203094465 U | 7/2013 |
| CN | 203102023 U | 7/2013 |
| CN | 103235602 A | 8/2013 |
| CN | 103292752 A | 9/2013 |
| CN | 103318405 A | 9/2013 |
| CN | 203193785 U | 9/2013 |
| CN | 203219298 U | 9/2013 |
| CN | 101811578 B | 10/2013 |
| CN | 103332296 A | 10/2013 |
| CN | 103353297 A | 10/2013 |
| CN | 103368103 A | 10/2013 |
| CN | 203301131 U | 11/2013 |
| CN | 102611200 B | 12/2013 |
| CN | 103454556 A | 12/2013 |
| CN | 103457654 A | 12/2013 |
| CN | 102589524 B | 1/2014 |
| CN | 203381787 U | 1/2014 |
| CN | 203387113 U | 1/2014 |
| CN | 203387114 U | 1/2014 |
| CN | 203397214 U | 1/2014 |
| CN | 102722178 B | 2/2014 |
| CN | 103587705 A | 2/2014 |
| CN | 103591938 A | 2/2014 |
| CN | 102736632 B | 3/2014 |
| CN | 103675609 A | 3/2014 |
| CN | 103684571 A | 3/2014 |
| CN | 203479958 U | 3/2014 |
| CN | 203567947 U | 4/2014 |
| CN | 102201865 B | 5/2014 |
| CN | 103796248 A | 5/2014 |
| CN | 103812052 A | 5/2014 |
| CN | 103823449 A | 5/2014 |
| CN | 103823450 A | 5/2014 |
| CN | 103823451 A | 5/2014 |
| CN | 103824233 A | 5/2014 |
| CN | 203608201 U | 5/2014 |
| CN | 203608303 U | 5/2014 |
| CN | 203608304 U | 5/2014 |
| CN | 102591355 B | 6/2014 |
| CN | 103839194 A | 6/2014 |
| CN | 103886189 A | 6/2014 |
| CN | 203658576 U | 6/2014 |
| CN | 203673535 U | 6/2014 |
| CN | 103941745 A | 7/2014 |
| CN | 103941746 A | 7/2014 |
| CN | 203681868 U | 7/2014 |
| CN | 203740134 U | 7/2014 |
| CN | 103963991 A | 8/2014 |
| CN | 104002963 A | 8/2014 |
| CN | 104029817 A | 9/2014 |
| CN | 104044725 A | 9/2014 |
| CN | 104062637 A | 9/2014 |
| CN | 104065860 A | 9/2014 |
| CN | 203825467 U | 9/2014 |
| CN | 203845019 U | 9/2014 |
| CN | 104071337 A | 10/2014 |
| CN | 104071342 A | 10/2014 |
| CN | 104076820 A | 10/2014 |
| CN | 104101332 A | 10/2014 |
| CN | 104122560 A | 10/2014 |
| CN | 203858359 U | 10/2014 |
| CN | 203864994 U | 10/2014 |
| CN | 203876987 U | 10/2014 |
| CN | 203881938 U | 10/2014 |
| CN | 203902839 U | 10/2014 |
| CN | 203902842 U | 10/2014 |
| CN | 203911339 U | 10/2014 |
| CN | 102879692 B | 11/2014 |
| CN | 104239899 A | 12/2014 |
| CN | 104242151 A | 12/2014 |
| CN | 203996897 U | 12/2014 |
| CN | 204010209 U | 12/2014 |
| CN | 204056303 U | 12/2014 |
| CN | 204089305 U | 1/2015 |
| CN | 204119375 U | 1/2015 |
| CN | 204119397 U | 1/2015 |
| CN | 104332894 A | 2/2015 |
| CN | 204144805 U | 2/2015 |
| CN | 204166080 U | 2/2015 |
| CN | 102915037 B | 3/2015 |
| CN | 102929288 B | 3/2015 |
| CN | 104406762 A | 3/2015 |
| CN | 104459285 A | 3/2015 |
| CN | 204191661 U | 3/2015 |
| CN | 204210729 U | 3/2015 |
| CN | 204210732 U | 3/2015 |
| CN | 204216106 U | 3/2015 |
| CN | 204223188 U | 3/2015 |
| CN | 102891453 B | 4/2015 |
| CN | 104483974 A | 4/2015 |
| CN | 104485606 A | 4/2015 |
| CN | 104494820 A | 4/2015 |
| CN | 104503465 A | 4/2015 |
| CN | 104527990 A | 4/2015 |
| CN | 104527991 A | 4/2015 |
| CN | 104535054 A | 4/2015 |
| CN | 104536459 A | 4/2015 |
| CN | 104536460 A | 4/2015 |
| CN | 104536467 A | 4/2015 |
| CN | 204236782 U | 4/2015 |
| CN | 204264449 U | 4/2015 |
| CN | 104597907 A | 5/2015 |
| CN | 104655114 A | 5/2015 |
| CN | 204310057 U | 5/2015 |
| CN | 204310058 U | 5/2015 |

(56) References Cited

FOREIGN PATENT DOCUMENTS

| | | |
|---|---|---|
| CN | 204313850 U | 5/2015 |
| CN | 204329971 U | 5/2015 |
| CN | 204331470 U | 5/2015 |
| CN | 103010070 B | 6/2015 |
| CN | 104670480 A | 6/2015 |
| CN | 104682267 A | 6/2015 |
| CN | 204399485 U | 6/2015 |
| CN | 104796672 A | 7/2015 |
| CN | 204433050 U | 7/2015 |
| CN | 204489177 U | 7/2015 |
| CN | 204497664 U | 7/2015 |
| CN | 104828254 A | 8/2015 |
| CN | 104836155 A | 8/2015 |
| CN | 104867134 A | 8/2015 |
| CN | 204548519 U | 8/2015 |
| CN | 204564608 U | 8/2015 |
| CN | 104883218 A | 9/2015 |
| CN | 104898653 A | 9/2015 |
| CN | 104898697 A | 9/2015 |
| CN | 104898700 A | 9/2015 |
| CN | 204615968 U | 9/2015 |
| CN | 106093618 A | 11/2016 |
| CN | 109255336 A | 1/2019 |
| CN | 110188786 A | 8/2019 |
| EP | 2983259 | 2/2016 |
| EP | 2983259 A | 2/2016 |
| EP | 3104184 A1 | 12/2016 |
| EP | 3253654 A1 | 12/2017 |
| EP | 3633396 A1 | 4/2020 |
| FR | 3035275 A1 | 10/2016 |
| JP | 2016135046 A | 7/2016 |
| JP | 2018034284 | 3/2018 |
| JP | 2018034285 | 3/2018 |
| RU | 2634931 C1 | 11/2017 |
| RU | 2646544 C1 | 3/2018 |
| RU | 2647106 C1 | 3/2018 |
| RU | 2017146365 A | 6/2019 |
| RU | 2703398 C1 | 10/2019 |
| WO | 2010014748 A1 | 2/2010 |
| WO | 2013135044 A1 | 9/2013 |
| WO | 2015/115927 A1 | 8/2015 |
| WO | 2015115927 A1 | 8/2015 |
| WO | 2017221235 A1 | 12/2017 |
| WO | 2017221236 A1 | 12/2017 |
| WO | 201816991 A1 | 1/2018 |
| WO | 2018015959 A1 | 1/2018 |
| WO | 2018015960 A1 | 1/2018 |
| WO | 201842692 A1 | 3/2018 |
| WO | 201842693 A1 | 3/2018 |
| WO | 2018104780 A2 | 6/2018 |
| WO | 2018104786 A1 | 6/2018 |
| WO | 2018104790 A1 | 6/2018 |
| WO | 2018185519 A2 | 10/2018 |
| WO | 2019168429 A1 | 9/2019 |
| WO | 2020161607 | 8/2020 |
| WO | 2020161607 A1 | 8/2020 |
| WO | 2020171743 A1 | 8/2020 |
| WO | 2020210131 | 10/2020 |

OTHER PUBLICATIONS https://www.youtube.com/watch?v=SFkDdyuJAIg&feature=youtu.be.
https://www.facebook.com/cablewalker/.
https://www.f6s.com/cablewalker.
https://tsuru.su/en/2020/06/08/cablewalker_first_automatic/.
E. Titov, O. Limanovskaya, A. Lemekh and D. Volkova, "The Deep Learning Based Power Line Defect Detection System Built on Data Collected by the Cablewalker Drone," 2019 International Multi-Conference on Engineering, Computer and Information Sciences (SIBIRCON), Novosibirsk, Russia, pp. 0700-0704, 2019. URL : https://ieeexplore.IEEE.org/document/8958397.
Asset management in grid companies using integrated diagnostic devices URL: https://www.witpress.com/elibrary/eq-volumes/4/3/2504.
The way for detecting defects of ground wires of power lines by the method of magnetic scanning URL: https://www.daaam.info/Downloads/Pdfs/proceedings/proceedings_2019/128.pdf.
https://www.uasvision.com/2015/09/09/aerial-robot-lands-on-powerlines/.
https://linebird.net/.
Pinto, Ary V az, et al. "Remote detection of internal corrosion in conductor cables of power transmission lines." 1st IEEE International Conference on Applied Robotics for the Power.
International Search Report and Written Opinion dated Feb. 22, 2018 for application PCT/CA2017/051385.
Montambault, S. et al., "Hydro-Quebec's Power Line Robotics Program: 15 years of development, implementation and partnerships." 3rd IEEE International Conference on Applied Robotics for the Power Industry) (CARPI), 2014.
Pagnano, A. et al., "A roadmap for automated power line inspection. Maintenance and repair." Procedia CIRP 12, 2013, pp. 234-239.
Barbosa et at., "Corrosion detection robot for energized power lines." 3rd International EEE Conference on Applied Robotics for the Power Industry (CARPI), 2014.
Extended European Search Report from corresponding European patent application 17873895.1, dated Apr. 22, 2020.
CIGRE Working Group B3.47, "Application of robotics in substations", brochure technique, reference: 807, 156 p., Jun. 2020. URL: https://e-cigre.org/publication/807-application-of-robotics-in-substations.
Gene Wolf, "Droidsand Drones", T&D World, Aug. 31, 2020. URL : https://www.tdworld.com/test-and-measurement/article/21138573/droids-and-drones.
J. Allan, J. Beaudry, "Robotic systems applied to power substations—A state-of-the-art survey," Proceedings of the 2014 3rd International Conference on Applied Robotics for the Power Industry, Foz do Iguassu, pp. 1-6, 2014. DOI: 10.1109/CARPI.2014.7030049 URL: https://ieeexplore.ieee.org/document/7030049.
Gregory Cole, Harshang Shah, Craig Stiegemeier, Jamie Stapleton, "ABB's TXplore robot redefines transformer inspection", ABB, Oct. 24, 2018. URL: https://new.abb.com/news/detail/7870/abbs-txplore-robot-redefines-transformer-inspection.
Apellix, "Aerial Robotic Systems for the Built Environment", Appelix.com.
Brent Barker, "Robots take on tough tasks in transmission and distribution", EPRI Journal, Jan. 29, 2019. URL : https://eprijournal.com/robots-take-on-tough-tasks-in-transmission-and-distribution/.
Luke Van Der Zel, "138-kV Research Substation", T&D World, Jul. 3, 2019. URL : https://www.tdworld.com/substations/article/20972818/138kv-research-substation.
EPRI, "Research on Substation Robot Application", Product ID 3002019592, Supplemental Project Notice, 2 p., Jun. 8, 2020 URL : https://www.epri.com/research/products/3002019592.
EPRI, "Robotic Inspection Technologies for Transformers: Laboratory and Field Assessments", Product ID 3002015700, Technical Update, 100 p., Jul. 19, 2019 URL : https://www.epri.com/research/products/3002019141.
EPRI, "Robotic Inspection Technologies for Transformers: Laboratory and Field Assessments", Product ID 3002019141, Technical Update, 105 p., Nov. 3, 2020. URL : https://www.epri.com/research/products/3002019141.
NS Energy Staff Writer, "Mini submersible robot successfully inspects power transformer", NS Energy Business, Jan. 26, 2020. URL : https://www.nsenergybusiness.com/news/mini-submersible-robot-successfully-inspects-power-transformer/.
Patrick Haddad, "NYPA successfully deploys submersible robot inside power transformer", Power Transformer News, Jan. 29, 2020 URL : https://www.powertransformernews.com/2020/01/29/_trashed/.
Chris Warren, "Can Artificial Intelligence Transform the Power System", EPRI Journal, 4 p., Jan./Feb. 2019. URL : https://eprijournal.com/wp-content/uploads/2019/01/2019.01-02A_Artificial-Intelligence.pdf.

(56) References Cited

OTHER PUBLICATIONS

EPRI, "Artificial Intelligence for Transmission Images", Product ID 3002020110, Supplemental Project Notice, 2 p., Oct. 29, 2020. URL : https://www.epri.com/research/products/3002020110.

Mike Putt, "Using Tomorrow's Technology Today", FPL, Mar. 28, 2018. URL : https://www.fplblog.com/using-tomorrows-technology-today/.

Laura Layden, "FPL shows off drone, robot technology", Naples Daily News, Jun. 2, 2016. URL : https://www.naplesnews.com/story/news/local/2016/06/02/fpl-shows-off-drone-robot-technology/86058584/.

FPL, "An even brighter future is on the horizon", YouTube, Feb. 3, 2020. URL : https://www.youtube.com/watch?v=La0gef3LAzs.

"Florida Power and Light using robot to spot malfunctioning equipment", WPTV News, May 3, 2018. URL : https://www.youtube.com/watch?v=M7UEOfOiws8.

"FPL reveals new autonomous substation robot", WPTV News, Apr. 11, 2018. URL : https://www.youtube.com/watch?v=mx_iiaMyRNc.

"FPL Debuts First Substation Robot in Miami-Dada County", Black PR Wire, Apr. 10, 2019. URL : https://www.blackprwire.com/press-releases/bprw-fpl-debuts-first-substation-robot-in-miami-dade-county.

Boston Dynamics, Twitter, Feb. 3, 2020. URL : https://twitter.com/bostondynamics/status/1224380527244910598.

Jackie Alkobi, "At Florida Power and Light, Autonomous Drones Speed Utility Emergency Response", Percepto, Apr. 16, 2020. URL : https://percepto.co/at-florida-power-and-light-autonomous-drones-speed-utility-emergency-response/.

Maureen Kenyon, "'Drone in a box' technology provides Florida Power & Light easier way to assess infrastructure", TC Palm, Feb. 20, 2020. URL : https://www.tcpalm.com/story/news/2020/02/19/fpl-drone-box-another-tool-check-plant-infrastructure/4760778002/.

Shoshanna Solomon, "Israeli drones to help Florida's emergency response to hurricane season", The Times of srael, Jul. 16, 2020. URL : https://www.timesofisrael.com/israeli-drones-to-help-floridas-emergency-response-to-hurricane-season/.

Xcel Energy, "Energy Innovation", 6 p., 2019. URL : https://www.xcelenergy.com/staticfiles/xe-responsive/Company/Corporate%20Responsibility%20Report/2019%20CRR/2019_Energy%20Innovation_CRR.pdf.

"FAA Approves Milestone Drone Flights for Xcel Energy", T&D World, Apr. 18, 2018. URL : https://www.tdworid.com/overhead-transmission/article/20971162/faa-approves-milestone-drone-flights-for-xcel-energy.

Eileen P. Lockhart, James Dwyer, J. Peter Gomez, "Xcel Energy Deploys Unmanned Aircraft Systems", F&D World, Jun. 13, 2018. URL : https://www.tdworld.com/substations/media-gallery/20971369/xcel-energy-deploys-unmanned-aircraft-systems.

Eileen P. Lockhart, James Dwyer, J. Peter Gomez, "UAS to the Rescue", T&D World, May 18, 2018. URL : https://www.tdworld.com/overhead-transmission/article/20971296/uas-to-the-rescue.

RG&E, "NYSEG and RG&E Testing Drones—A New Tool for the Reliability Tool Box", 2015. URL : https://www.rge.com/wps/portal/rge/networksfooter/ourcompany/!ut/p/z0/hYyxTsNAEER_ZSISRns2DgplZCEQyAE6c421ds6Xg2PXOS8Q_z0GCqhlN6N589BijZbpPXjSIExx7k_2ojnPqqubojTb68v1xjyaslw_bO9yU2R4i_Yf4D77MuSpKiuPdiDdLwP3grW8pU5eB-KpF1GX TniKb094PhzsBm0nrO6oWCfvyKfmV7YwfzN3DbuPcWFyk63m Oo3OA_EO5h-bGzWwh10SdiMsgWCGQUUi9JJA9w6Si4HaEINOP0MrRxxebLuK_ uwThrwCuw!!/.

ULC Robotics, "Electric Utility Innovation: Circuit Breaker Racking Robot". URL : https://ulcrobotics.com/network-innovation-and-energy-industry-research-and-development/breaker-racking-robot/.

Elizabeth Leland, "Robot keeps workers away from hazards", Duke Energy, Dec. 16, 2019. URL : https://Illumination.duke-energy.com/articles/robot-keeps-workers-away-from-hazards.

"InoLECT releases wireless version of inoRAC", BIC Magazine, Jun. 12, 2018. URL : https://www.bicmagazine.com/resources/products-services/inolect-releases-wireless-version-of-inorac/.

"Remote Racking with inoRAC2 : Universal Remote Racking Device", YouTube, Mar. 28, 2016. URL : https://www.youtube.com/watch?v=-mRQ6wdFiRk.

F. Aminifar, F. Rahmatian, "Unmanned Aerial Vehicles in Modern Power Systems: Technologies, Use Cases, Outlooks, and Challenges," in IEEE Electrification Magazine, vol. 8, No. 4, pp. 107-116, Dec. 2020. URL: https://ieeexplore.ieee.org/document/9276537.

ULC Robotics, "Increasing substation efficiency using unmanned aerial inspection". URL : https://ulcrobotics.com/project/uav-substation-inspection-2018/.

"World's First UT Integrated Drone Deployed", NDT.org, Nov. 1, 2017. URL : https://www.ndt.org/news.asp?projectID=62398.

Prodrone, "Prodrone was awarded the FY2020 "Intellectual Property Achievement Awards"", Jun. 8, 2020. URL: https://www.prodrone.com/notice/6585/.

"Une plate-forme de gestion et d'exploitation des donnees collectées par drone", Enerzine, Mar. 26, 2019. URL : https://www.enerzine.com/une-plate-forme-de-gestion-et-dexploitation-des-donnees-collectees-par-drone/26841-2019-03.

"Drone Automation Software Features AI-Powered Analytics", T&D World, Jun. 7, 2020. URL : https://www.tdworld.com/vegetation-management/article/21133338/drone-automation-software-enables-organizations-to-plan-operate-analyze-and-collaborate-global-drone-missions.

"ANRA Technologies Launches Drone Flight Management System", T&D World, Oct. 20, 2020. URL : https://www.tdworld.com/test-and-measurement/article/21145296/anra-technologies-launches-drone-flight-management-system.

Ashley Carman, "Here's a drone with claws", The Verge/Circuit Breaker, Sep. 11, 2016. URL: https://www.theverge.com/circuitbreaker/2016/9/11/12879206/prodrone-claw-arm-drone.

Robert Beckhusen, Robo-Chopper Dives and Grabs Objects Like a Bird of Prey, Wired, Mar. 19, 2013. URL : https://www.wired.com/2013/03/drone-claw/.

Voliro, "Solution" page of website, Voliro AG.

European Search Report, EP17873895.1, dated Jul. 9, 2021.

https://www.theverge.com/circuitbreaker/2016/9/11/12879206/prodrone-claw-arm-drone.

Video: Robo-Chopper Dives and Grabs Objects Like a Bird of Prey; https://www.wired.com/2013/03/drone-claw/.

https://voliro.com/solution/.

https://www.apellix.com/.

\* cited by examiner

UNMANNED AERIAL VEHICLE FOR MONITORING AN ELECTRICAL LINE

CROSS-REFERENCE TO RELATED APPLICATIONS

This application is a 371 application of International application No. PCT/CA2017/051385 filed Nov. 21, 2017, which claims the priority of U.S. provisional patent application No. 62/425,235 filed Nov. 22, 2016, the entire contents of each of which are incorporated by reference herein.

TECHNICAL FIELD

The application relates generally to electrical power lines and, more particularly, to a vehicle and method for monitoring components of same.

BACKGROUND

It is sometimes necessary to inspect or monitor the components of aerial electric power lines. For some power lines, these components are often disposed very high above the ground, making them difficult to access. One technique for accessing the remote component involves sending a robot along the power line. Mounting the robot to the power line, particularly one that is disposed high above the ground, is time-consuming and cumbersome. Another technique involves raising a human technician from the ground or having the technician scale a neighbouring structure in proximity to the component. This presents inherent hazards for the technician, and often requires that the power line be shut off.

SUMMARY

In one aspect, there is provided an unmanned aerial vehicle mountable to an aerial conductor of an electricity transmission line to monitor a component thereof, the unmanned aerial vehicle comprising: a body having a propulsion system to lift, lower, and navigate the vehicle; a component monitoring tool mounted to the body and vertically displaceable between a first position and a second position, the tool in the first position being vertically spaced from the component, the tool in the second position being engaged with the component; and a displacement assembly mounted to at least one of the body and the tool and comprising at least one displacement member to displace the body and the tool along the conductor.

In an embodiment, the component monitoring tool is vertically displaceable with the body between the first and second positions.

In an embodiment, the displacement assembly is mounted to the body, the at least one displacement member being suspended from the body and being vertically displaceable relative thereto.

In an embodiment, the at least one displacement member is spaced from the body in the first position, and the at least one displacement member is in proximity to the body in the second position.

In an embodiment, the body has a motor coupled to the at least one displacement member, the motor being operable to drive the at least one displacement member between the first and second positions.

In an embodiment, the at least one displacement member in the second position is disengaged from the conductor upon the tool being in the second position and engaged with the component.

In an embodiment, the component monitoring tool is vertically displaceable with respect to the body between the first and second positions.

In an embodiment, the displacement assembly is mounted to the tool and the at least one displacement member is fixedly mounted to the tool to be vertically displaced therewith.

In an embodiment, the at least one displacement member mounted to the tool is operable to displace the body and the tool along the conductor upon the tool being in the second position and engaged to the component.

In an embodiment, the at least one displacement member includes two wheels mounted to the body and spaced apart from one another along a length of the body, each wheel being independently vertically displaceable.

In another aspect, there is provided a method of positioning an unmanned aerial vehicle relative to a component of an aerial conductor of an electricity transmission line, the method comprising: positioning an unmanned aerial vehicle on the conductor, the unmanned aerial vehicle having a component monitoring tool mounted thereto; displacing the unmanned aerial vehicle along the conductor until the tool is disposed in proximity to the component; and lowering the tool toward the component to engage the component with the tool.

In an embodiment, the method further includes raising the tool above the component after engaging the component with the tool, and displacing the unmanned aerial vehicle along the conductor.

In an embodiment, lowering the tool includes simultaneously lowering the unmanned aerial vehicle and the tool toward the component.

In an embodiment, lowering the tool includes lowering the tool with respect to a remainder of the unmanned aerial vehicle.

In an embodiment, lowering the tool includes lowering only the tool and maintaining a remainder of the unmanned aerial vehicle stationary.

In an embodiment, lowering the tool includes supporting the unmanned aerial vehicle with the tool engaged with the component.

In another aspect, there is provided an unmanned aerial vehicle mountable to an aerial conductor of an electricity transmission line to monitor a component thereof, the unmanned aerial vehicle comprising: a body having a propulsion system to navigate the vehicle; and a component monitoring tool mounted to the body and vertically displaceable between a first position and a second position, the tool in the first position being vertically spaced from the component, the tool in the second position being engaged with the component.

In an embodiment, the component monitoring tool is vertically displaceable with the body between the first and second positions.

In an embodiment, the unmanned aerial vehicle further includes a displacement assembly mounted to at least one of the body and the tool and comprising at least one displacement member to displace the body and the tool along the conductor.

In an embodiment, the displacement assembly is mounted to the body, the at least one displacement member being suspended from the body and being vertically displaceable relative thereto.

In an embodiment, the at least one displacement member is spaced from the body in the first position, and the at least one displacement member is in proximity to the body in the second position.

In an embodiment, the body has a motor coupled to the at least one displacement member, the motor being operable to drive the at least one displacement member between the first and second positions.

In an embodiment, the at least one displacement member in the second position is disengaged from the conductor upon the tool being in the second position and engaged with the component.

In an embodiment, the component monitoring tool is vertically displaceable with respect to the body between the first and second positions.

In an embodiment, the displacement assembly is mounted to the tool and the at least one displacement member is fixedly mounted to the tool to be vertically displaced therewith.

In an embodiment, the at least one displacement member mounted to the tool is operable to displace the body and the tool along the conductor upon the tool being in the second position and engaged to the component.

In an embodiment, the at least one displacement member includes two wheels mounted to the body and spaced apart from one another along a length of the body, each wheel being independently vertically displaceable.

DESCRIPTION OF THE DRAWINGS

Reference is now made to the accompanying figures in which.

DETAILED DESCRIPTION

Figure 1A:
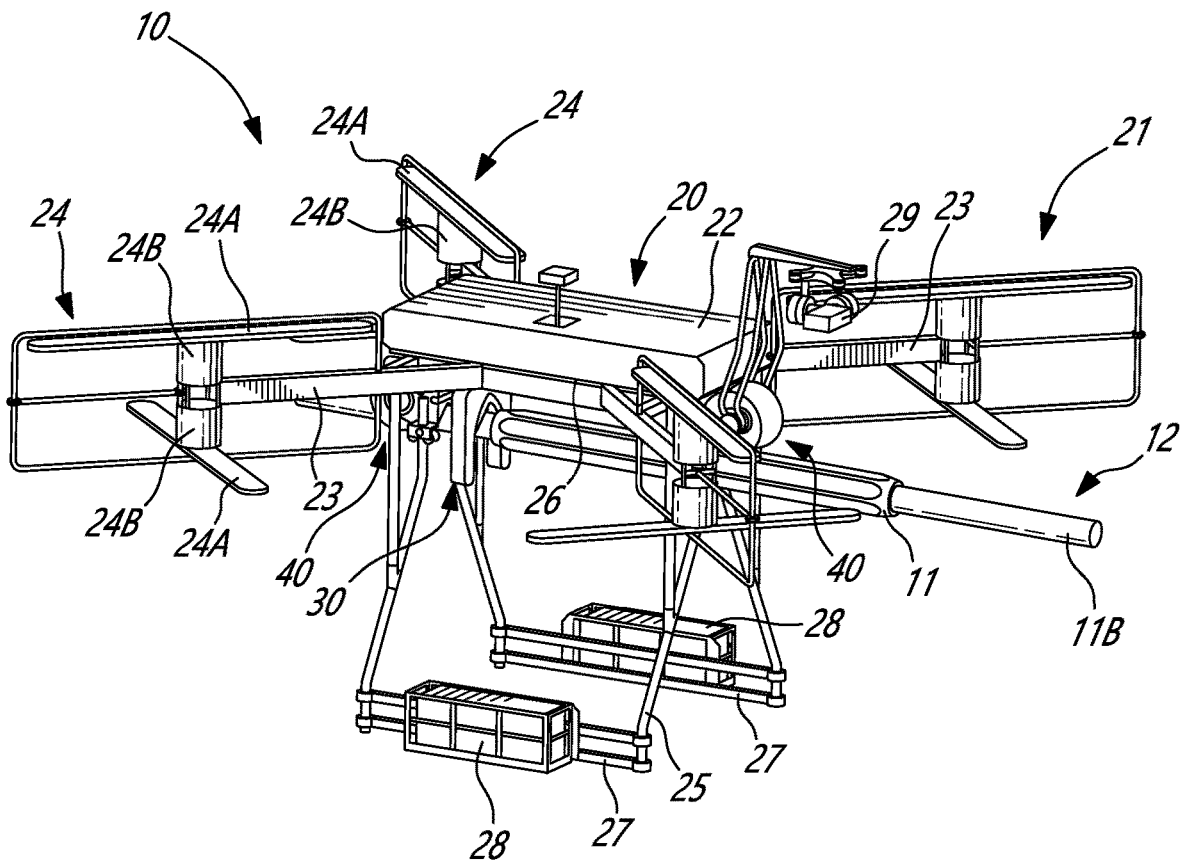
FIG. 1A is a perspective view of an unmanned aerial vehicle mounted to a component of an aerial conductor of an electricity transmission line, according to an embodiment of the present disclosure.
Figure 1B:
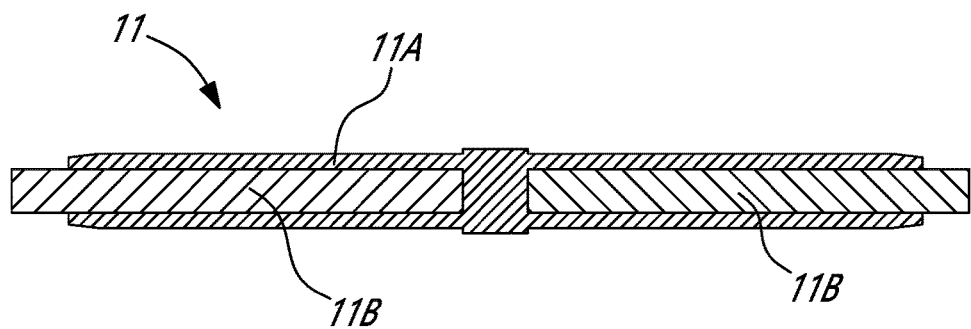
FIG. 1B is a side cross-sectional view of the conductor and the component of the electricity transmission line of FIG. 1A.

FIGS. 1A and 1B illustrate an unmanned aerial vehicle 10 for monitoring a component 11 of an aerial conductor 11B of an aerial electricity transmission line 12. When landed thereon, the unmanned aerial vehicle 10 (sometimes referred to herein as "UAV 10") is supported by the aerial conductor 11B (sometimes referred to herein simply as "conductor 11B"). As will be explained in greater detail below, the UAV 10 helps a technician, positioned remotely from the component 11, to inspect or monitor the component 11. The UAV 10 therefore contributes to the inspection, monitoring, and/or maintenance of components 11 of transmission lines 12.

In FIG. 1B, the component 11 to be monitored by the UAV 10 is a sleeve or connector 11A. The component 11 to be monitored can also be the current-carrying or non-energised conductor 11B itself. The connector 11A is mounted about the conductor 11B, and helps to connect together two different conductors 11B, as shown in FIG. 1B. In alternate embodiments, the UAV 10 is used to monitor other energized and non-energized components 11 of the transmission line 12, including, but not limited to, connectors, splices, switching devices, mid-span or dead-end sleeves joining two segments of the transmission line 12, spacers that maintain the right distances between adjacent transmission lines 12, or parts of the cable or strands making up the transmission line 12 itself. The UAV 10 can therefore be mounted on various configurations of the transmission line 12, including but not limited to, a single conductor, an overhead ground wire, or bundles of two, three, four, or more conductors. The UAV 10 can also be mounted on other types of power lines, such as distribution lines, and is not restricted to being used on a transmission line 12.

The aerial conductor 11B of the aerial transmission line 12 is elevated from a ground surface. Conventional line monitoring requires line technicians to be raised from the ground surface, or to climb upward, to position themselves in proximity to the component 11. With very high aerial conductors 11B, such as those of high-voltage aerial transmission lines 12, it is difficult to lift the technician to the appropriate height, and there are risks associated with doing so. In contrast to this conventional technique, the UAV 10 monitors the component 11 without having to raise a human technician to the level of the transmission line 12, and without having to deactivate an energised transmission line 12. The UAV 10 has flight capability. It can therefore be piloted by the technician, who is positioned safely away from the transmission line 12, to be brought to rest on the component 11 requiring monitoring. Alternatively, the UAV 10 can be piloted by the technician to rest on the conductor 11B in proximity to the component 11, and then displaced along the conductor 11B in the direction of the component 11. The UAV 10 in FIG. 1A has a body 20, a component monitoring tool 30 mounted to the body 20 to monitor the component 11, and a displacement assembly 40 for displacing the UAV 10 along the conductor 11B and positioning the component monitoring tool 30.

Referring to FIG. 1A, the body 20 forms the corpus of the UAV 10 and provides structure thereto. The body 20 has a propulsion system 21 for providing lift to the UAV 10 and directional control during flight. The body 20 can take any suitable form to achieve such functionality. In the depicted embodiment, the body 20 has a housing 22 which contains the control unit of the UAV 10. The control unit wirelessly transmits data to the technician or to a remote server, and receives instructions therefrom. In alternate embodiments, the control unit provides autonomous flight control to the UAV 10. The control unit has a processor that processes the data communicated to and from the control unit, and runs algorithms to help the UAV 10 function. Arms 23 extend outwardly from the housing 22 to rotor assemblies 24 of the propulsion system 21. A landing gear 25 is mounted on the arms 23, and has lower opposed feet 27 for supporting the UAV 10 and maintaining it upright when it is on a level surface. Weights/batteries 28 are provided on the landing gear 25 adjacent to the feet 27 to lower the center of gravity of the UAV 10. The lowered center of gravity of the UAV 10 provides it with improved stability and balance when it is unsupported by a level surface, such as when it is resting on the transmission line 12. Each of the rotor assemblies 24 includes one or more rotor blades 24A and an electric motor 24B for driving the rotor blades 24A. The control unit communicates with and coordinates the rotor assemblies 24 to generate lift for the UAV 10 and to manoeuvre it during flight in response to the remote control instructions provided by the technician. In the depicted embodiment, the propulsion system 21 has a camera 29 to provide live visual feedback of the conductor 11B and its components 11. This visual feedback is communicated by the control unit to the technician, and helps the technician to navigate the UAV 10 relative to the conductor 11B and component 11. It will be appreciated that the body 20 is not limited to the above-described configuration, and that other configurations for the body 20 are within the scope of the present disclosure.

Figure 2A:
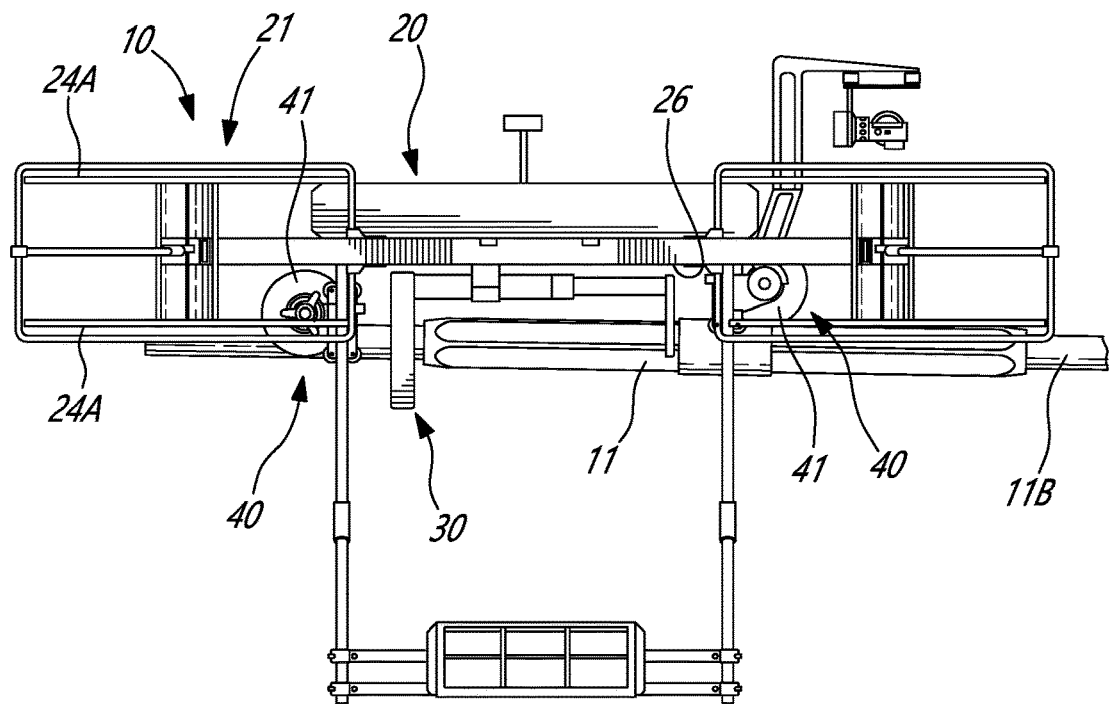
FIG. 2A is side view of the unmanned aerial vehicle of FIG. 1A.

Referring to FIG. 2A, the component monitoring tool 30 (sometimes referred to herein simply as "tool 30") is used by for monitoring the state of the conductor 11B and/or the component 11, or taking measurements therefrom. Although shown and described herein as being used primarily for diagnostic purposes, the tool 30 in alternate embodiments is used for interventions on the conductor 11B and/or component 11. These interventions include, but are not limited to, inspection, repair, or other maintenance tasks. In the depicted embodiment, the tool 30 includes an ohmmeter, and is used to measure the electrical resistance of the component 11 and/or conductor 11B. The electrical resistance of the component 11 is determined by knowing or measuring the amperage in the conductor 11B and then measuring the voltage drop due to the resistance of the component 11 being tested. It will be appreciated that the electrical resistance of the component 11, typically expressed in ohm ($\Omega$), is a measure of the difficulty of passing an electric current through the component 11. If the component 11 generates greater electrical resistance, it may be indicative that the component 11 is physically damaged, and thus requires further inspection, repair, or replacement. The electrical resistance of the component 11 can also be used as a proxy for the state of physical degradation of the component 11. In an alternate embodiment, the tool 30 includes a device for determining the extent of galvanic protection on the conductor 11B and/or the component 11. In another alternate embodiment, the tool 30 includes a X-ray device for capturing images of the interior of the component 11. In yet another alternative environment, the tool 30 includes an abrasive member for rubbing against an outer surface of the component 11 to clean it. It can thus be appreciated that the tool 30 is not limited to the depicted embodiment, and that other types of tools 30 for monitoring the component 11 are within the scope of the present disclosure.

The tool 30 is mounted to, and removable from, the body 20. In the depicted embodiment, the tool 30 is mounted to the underside portion 26 of the body 20, and thus is disposed below the body 20. The tool 30 is mounted in a fixed relationship with the body 20 such that there is no relative displacement between the tool 30 and the body 20. This positioning of the tool 30 helps the technician to navigate the tool 30 toward the conductor 11B by simply lowering the UAV 10 onto the transmission line 12. In alternate embodiments, the tool 30 is mounted elsewhere on the body 20, and is not in a fixed relationship with the body 20.

The tool 30 engages with, and is disengaged from, the component 11. The term "engage" refers to the ability to the tool 30 to directly abut against the component 11, or to be in close proximity thereto, in order to effect the monitoring operation. As will be described in greater detail below, the tool 30 is vertically displaceable between a raised first position and a lowered second position. In the depicted embodiment, the displacement assembly 40 mounted to the body 20 causes the vertical displacement of the tool 30. In alternate embodiments, and as described in greater detail below, the tool 30 itself vertically displaces between the first and the second positions. In the first position, the tool 30 is spaced from the component 11 to be monitored. The tool 30 is in the first position during flight, and when the UAV 10 is being displaced along the conductor 11B, for example. In the second position, the tool 30 is engaged with the component 11 to effect the monitoring operation. When the tool 30 is engaged with the component 11 in the second position, the UAV 10 is resting or stationary on the conductor 11B.

Figure 2B:
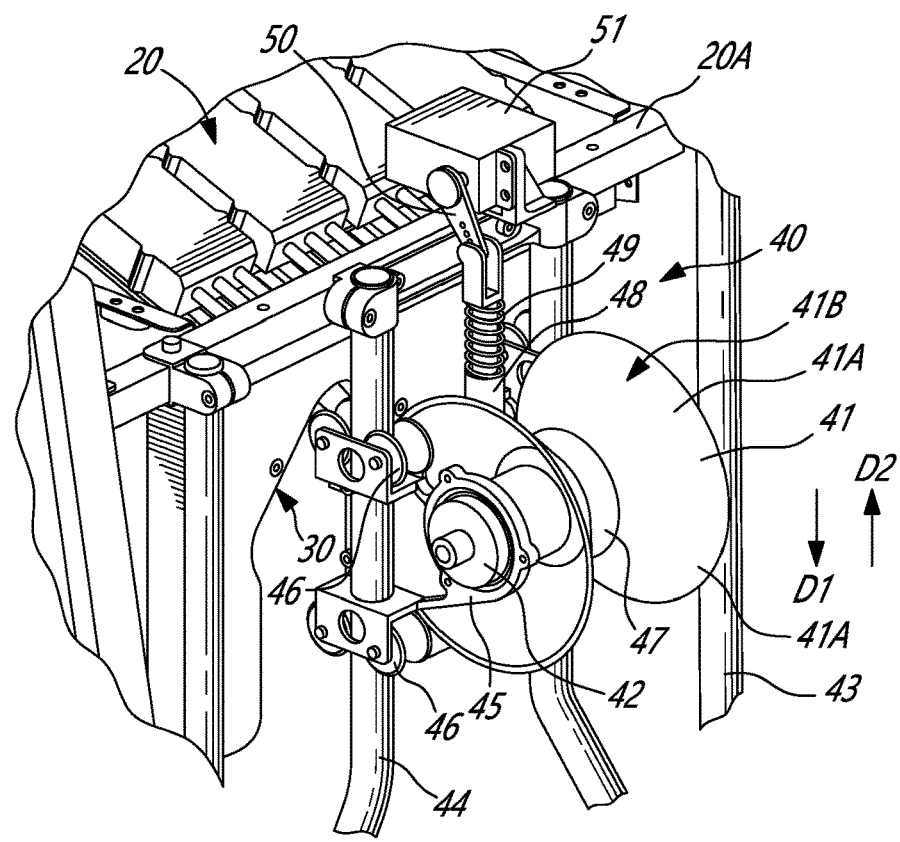
FIG. 2B is an enlarged view of a displacement assembly of the unmanned aerial vehicle of FIG. 1A.

Referring to FIGS. 2A and 2B, in the depicted embodiment, the displacement assembly 40 of the UAV 10 displaces the body 20 and the tool 30 along the conductor 11B when the UAV 10 is resting thereon, and also helps the tool 30 to engage the component 11. The movement of the UAV 10 along the conductor 11B is independent of the vertical movement of the tool 30 to and away from the component 11. The displacement assembly 40 is mounted to one or both of the body 20 and the tool 30. In the embodiment of FIGS. 2A and 2B, the displacement assembly 40 is mounted to only the body 20. The displacement assembly 40 includes one or more displacement members 41 to displace the body 20 and the tool 30 along the conductor 11B toward and away from the component 11. In the depicted embodiment, the displacement members 41 are wheels, and the displacement assembly 40 is therefore sometimes referred to herein as a "wheel assembly". Other configurations of the displacement assembly 40 are also within the scope of the present disclosure. For example, in an alternate embodiment, the displacement assembly 40 includes displacement members 41 that are skids or skates for displacing along the conductor 11B. It will therefore be appreciated that references to "wheels" or "wheel assemblies" herein does not limit the displacement assembly 40 to only having wheels. In yet another alternate embodiment, the UAV 10 does not have a displacement assembly 40, and is able to position itself on the conductor 11B using only the propulsion system 21.

The displacement of the body 20 and the tool 30 is effected by electric motors 42, each being engaged with a corresponding wheel 41, to drive the wheels 41 along the conductor 11B. In an alternate embodiment, the displacement of the body 20 and the tool 30 along the conductor 11B is effected by the propulsive forces generated by the rotor blades 24A of the propulsion system 21. The rotor blades 24A are coordinated by the control unit to propel the UAV 10 along the conductor 11B.

In addition to being displaceable along the conductor 11B, the wheels 41 are independently vertically displaceable or adjustable relative to the body 20 of the UAV 10. More particularly, the wheels 41 are moveable towards the body 20, and away therefrom. This relative movement of the wheels 41 helps to displace the tool 30 to engage the component 11, and to be displaced between the first and the second positions described above. The independent displacement of the wheels 41 is more clearly shown in FIG. 2A where one wheel 41 is positioned on the component 11 higher than the other wheel 41 positioned on the conductor 11B.

Each wheel assembly 40 can have any configuration to achieve such functionality. For example, the wheel assembly 40 shown in FIG. 2B is mounted to the body 20. More particularly, the wheel assembly 40 includes a frame 43 mounted in fixed relationship to a cross-beam 20A of the body 20. The frame 43 includes one or more vertical displacement arms 44 which guide the vertical displacement of the wheel 41. A bracket 45 attaches the wheel 41 to the displacement arm 44 and facilitates vertical displacement of the wheel 41 with respect to the displacement arm 44. The bracket 45 has guide rollers 46 which engage an outer surface of the displacement arm 44 to guide vertical displacement of the wheel 41. The electric motor 42 is shown housed within a hollow transverse axle 47 of the wheel 41 and is mounted therein with suitable bearings. The electric motor 42 propels the wheel 41 for displacement along the conductor 11B.

The wheel 41 is suspended from the body 20. In the depicted embodiment, the wheel 41 is connected to a suspension arm 48 having a spring device 49 used to cushion the body 20 by compression, thereby absorbing the landing impact of the UAV 10 on the conductor 11B. The suspension arm 48 is linked to an actuation arm 50 connected to a servomotor 51 that is fixed to the cross-beam 20A. To displace the wheel 41 in downward direction D1 away from the body 20, the servomotor 51 rotates the actuation arm 50 downward in order to push the suspension arm 48 and the wheel 41 downward. To displace the wheel 41 in upward direction D2 toward the body 20, the servomotor 51 rotates the actuation arm 50 upward in order to pull the suspension arm 48 and the wheel 41 upward. The displacement of the wheel 41 in the upward direction D2 toward the body 20 is constrained to prevent the wheel 41 from impacting the body 20. In the depicted embodiment, the wheel 41 has upper and lower V-shaped sections 41A that define a central groove 41B to receive and mate with the conductor 11B and/or the component 11, and to more stably guide the displacement of the wheel 41 along the conductor 11B. Other configurations of the displacement or wheel assembly 40 are within the scope of present disclosure, at least one of which is described in greater detail below.

Figure 3A:
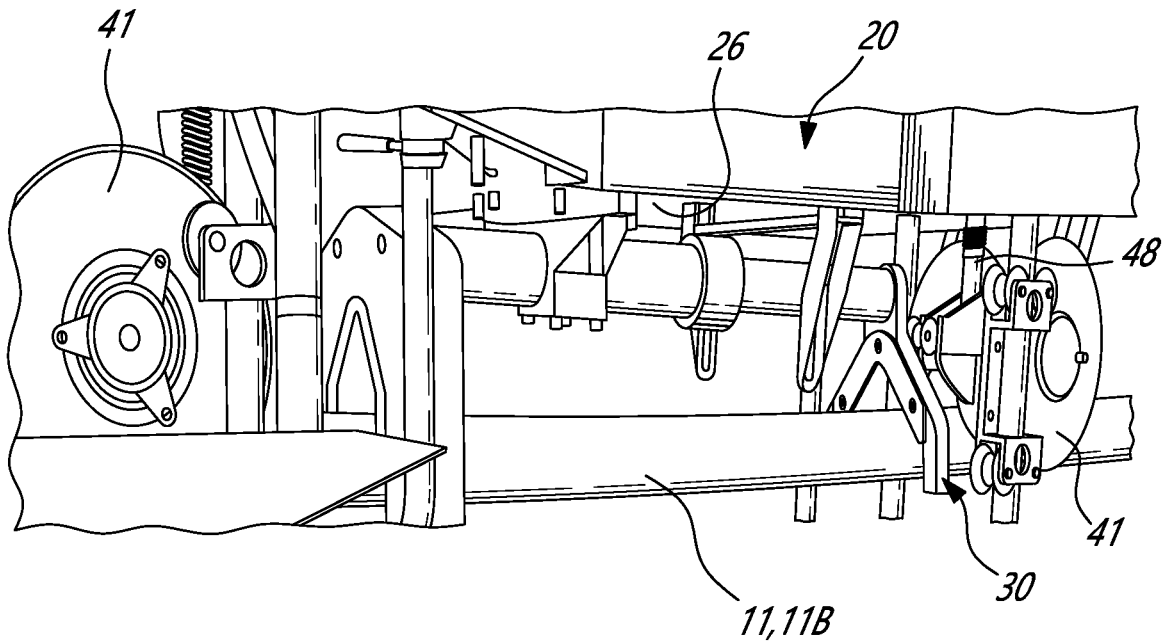
FIG. 3A is a perspective of the displacement assembly of the unmanned aerial vehicle of FIG. 1A, being shown in a first position.
Figure 3B:
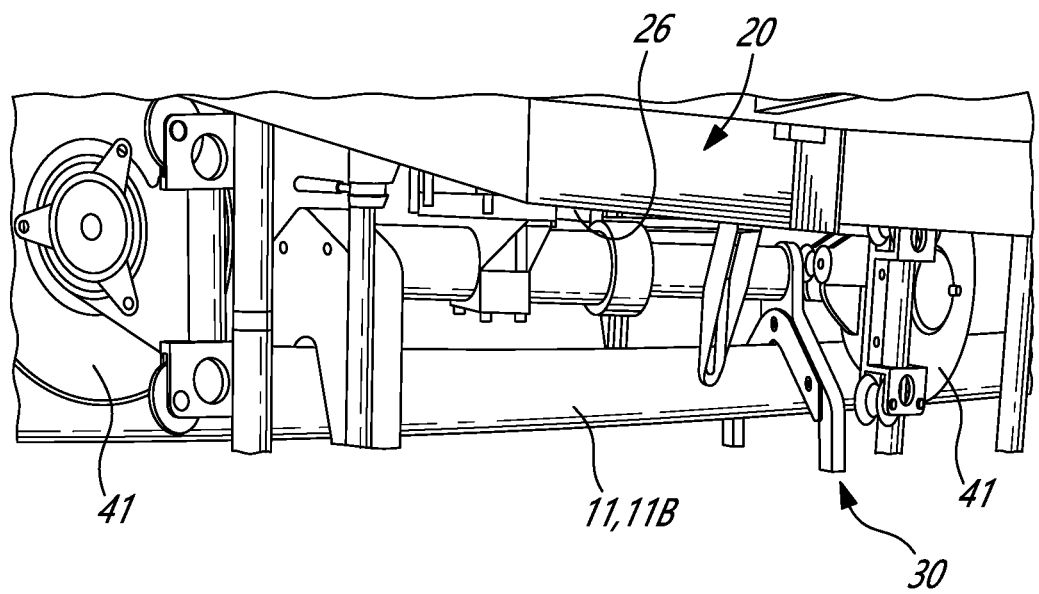
FIG. 3B is a perspective of the displacement assembly of the unmanned aerial vehicle of FIG. 1A, being shown in a second position.

The vertical displacement of the wheels 41 relative to the body 20 of the UAV 10 is more clearly shown in FIGS. 3A and 3B. FIG. 3A shows the wheels 41 and the tool 30 in the first position. In the first position, the wheels 41 are spaced furthest away from the underside portion 26 of the body 20, and the tool 30 is spaced apart from the component 11. The first position is the default position for the wheels 41 and the tool 30. Some examples of operating modes in which the wheels 41 and the tool 30 are in the first position include flight, in which the wheels 41 are suspended below the body 20, and the tool 30 is not in proximity to the conductor 11B or the component 11. Another operating mode includes displacement of the UAV 10 along the conductor 11B where the wheels are in contact with the conductor 11B, by using the motors 42 of the wheels, or by using the propulsion energy from the propulsion system 21.

FIG. 3B shows the wheels 41 and the tool 30 in the second position. In the second position, the wheels 41 are spaced closest to the underside portion 26 of the body 20, and the tool 30 is engaged with the conductor 11B or component 11. In the depicted embodiment, the tool 30 includes an ohm-meter that abuts against an external surface of the component 11 (which is the conductor 11B, in the depicted embodiment). The second position is adopted when the technician wishes to lower the tool 30 to engage the component 11 to effect the monitoring operation. During flight, the technician commands the UAV 10 to generate less lift, which causes the wheels 41 to descend toward the conductor 11B. The UAV 10 continues descending until the wheels 41 abut against the conductor 11B, thereby supporting the weight of the UAV 10. The technician can then command the UAV 10 to shut off the rotor blades 24A so that the UAV 10 rests on the conductor 11B. To engage the tool 30 on the conductor 11B or component 11, the technician commands the servomotors 51 to rotate the actuation arms 50 upward in order to bring the wheels 41 closer to the body 20, so that the distance between the underside portion 26 of the body 20 and the wheels 41 becomes smaller. This has the effect of lowering the body 20 and the tool 30 closer to the component 11 to engage same. The tool 30 is then engaged with the component 11, and can perform the monitoring operation. The wheels 41 are disengaged from the outer surface of the conductor 11B when the tool 30 is engaged with the component 11 in the second position. The weight of the UAV 10 is therefore being supported entirely by the tool 30. The disengagement of the wheels 41 from the conductor 11B also prevents the UAV 10 from being displaced along the conductor 11B while the tool 30 is performing the monitoring operation. This contributes to the safe operation of the UAV 10.

The wheels 41 and the tool 30 can be displaced multiple times between the first and the second positions. For example, in an embodiment, when the UAV 10 is inspecting the component 11, it must take multiple measurements on and about the component 11. In the embodiment where the component 11 is a sleeve, the UAV 10 is displaced and then lowered over the conductor 11B to take a control measurement thereof. The UAV 10 is then raised, and displaced along the conductor 11B to one end of the sleeve 11, and lowered to take a second measurement. Finally, the UAV 10 is again raised and displaced along the conductor 11B to take a final measurement at the other end of the sleeve 11.

Figure 4A:
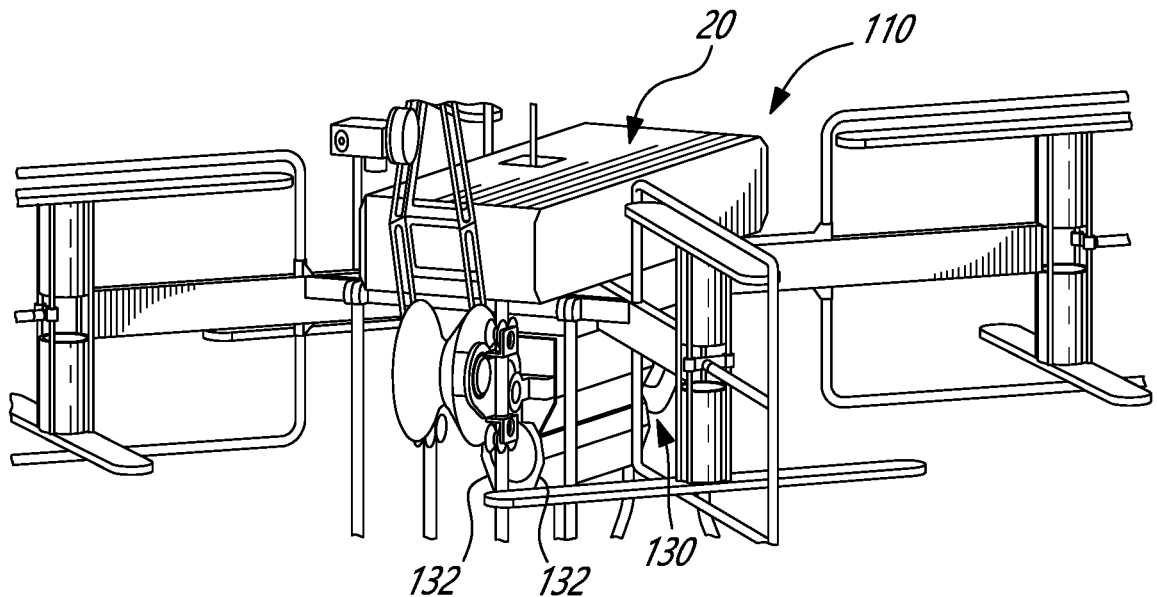
FIG. 4A is a perspective view of an unmanned aerial vehicle, according to another embodiment of the present disclosure.
Figure 4B:
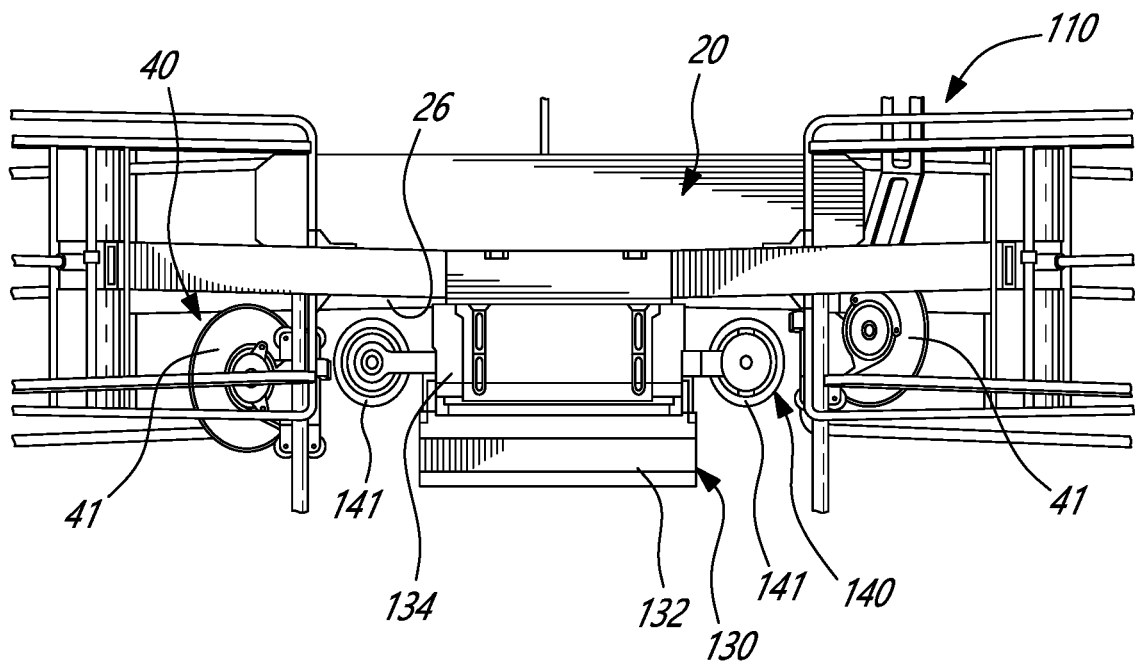
FIG. 4B is side view of the unmanned aerial vehicle of FIG. 4A.

FIGS. 4A and 4B show another embodiment of the UAV 110. The UAV 110 is identical to the UAV 10 described above except for the component monitoring tool 130 mounted to the body 20. Therefore, similar components to the UAV 10 will not be described again, and similar reference numbers will be used in FIGS. 4A and 4B. The component monitoring tool 130 is mounted to be vertically displaceable relative to the body 20. The tool 130 in the depicted embodiment is used to inspect or monitor the conductor 11B. The tool 130 helps to determine the condition of the galvanic protection on the conductor 11B, and can be used when the conductor 11B is energized or not. The tool 130 helps to accurately measure the thickness of the layer of zinc across an entire span, detecting anomalies caused by corrosion with a minimum of sampling. The data collected by the tool 130 can be used to calculate line degradation and help evaluate its remaining service life.

As shown in FIG. 4A, the tool 130 has closure members 132 which are mechanized to close about the external surface of the conductor 11B without abutting directly against the external surface of the conductor 11B. The closure members 132 are thus able to center the conductor 11B between them. In the depicted embodiment, the closure members 132 are doors which are pivotable about a hinge. The tool 130 has a mounting body 134 which is mountable to the underside portion 26 of the body 20, and displaceable with respect thereto. Stated differently, the tool 130 in the depicted embodiment is itself vertically displaceable relative to the body 20 of the UAV 110.

The tool 130 has its own displacement assembly 140, which is mounted thereto. The displacement assembly 140 is used in addition to the displacement assembly 40 described above. In an alternate embodiment, the UAV 110 only has one displacement assembly 140, which is mounted to the tool 130, and does not have the displacement assembly 40. The displacement assembly 140 is fixedly mounted to the mounting body 134 and displaceable therewith. In the first position, where the tool 130 is suspended freely above the conductor 11B, the wheels 141 of the displacement assembly 140, as well as the tool 130, are spaced furthest away from the underside portion 26 of the body 20.

In the second position, the wheels 141 are spaced closest to the underside portion 26 of the body 20, and the tool 130 is engaged with the conductor 11B. The second position is adopted when the technician engages the tool 130 on the conductor 11B to effect the monitoring operation. In order position the tool 130 about the conductor 11B, the UAV 110 is lowered until the wheels 141 of the tool 130 engage the conductor 11B. The wheels 141 of the displacement assembly 140 enter into contact with the conductor 11B. As the UAV 110 is further lowered, the wheels 141 are displaced upwardly by the conductor 11B because the tension in the conductor 11B pushes upwardly against the wheels 141. The wheels 141 are therefore brought closer to the underside portion 26 of the body 20. The wheels 141 are fixedly attached to the tool 130, and thus the upward movement of the wheels 141 causes the tool 130 to also be displaced vertically upward relative to the body 20. Stated differently, the distance between the underside portion 26 of the body 20 and the mounting body 134 of the tool 130 becomes smaller. The closure members 132 are now positioned to be closed about the conductor 11B.

In the second position, the wheels 141 of the displacement assembly 140 remain engaged with the conductor 11B. It is therefore possible to displace the UAV 110 along the conductor 11B with the wheels 141 while the closure members 132 of the tool 130 are engaged around the conductor 11B to monitor it. In the depicted embodiment, therefore, the displacement of the vehicle 110 along the conductor 11B is performed by the tool 130 and its displacement assembly 140.

There is also disclosed a method of positioning the unmanned aerial vehicle 10,110 relative to the component 11. The method includes positioning the UAV 10,110 on the conductor 11B and displacing the UAV 10,110 along the conductor 11B until the component monitoring tool 30,130 is disposed in proximity to the component 11. The method also includes lowering the tool 30,130 toward the component 11 to engage the component 11 with the tool 30,130.

It can be appreciated that the UAV 10,110 disclosed herein allows for the relatively easy, safe, and reproducible monitoring of a component 11 of an energised high or low voltage aerial electricity conductor 11B of a transmission line 12. The UAV 10,110 eliminates the need for a human technician to be raised to the level of the component 11, thereby improving the safety of the monitoring operation and reducing its complexity.

The displacement assembly 140 disclosed herein allows for the passive adjustment of the tool 130 relative to the conductor 11B. Indeed, the displacement assembly 140 allows the UAV 110 to be lowered so as to position the tool 130 to engage the component 11, and the wheel assemblies 140 return automatically to a default position when the tool 130 is no longer engaged with the conductor 11B.

The above description is meant to be exemplary only, and one skilled in the art will recognize that changes may be made to the embodiments described without departing from the scope of the invention disclosed. For example, although the expression "unmanned aerial vehicle" is used herein, the UAV 10,110 may also be referred to as a "drone", a "remotely piloted aircraft", an "unmanned aerial system", and other like terms. Still other modifications which fall within the scope of the present invention will be apparent to those skilled in the art, in light of a review of this disclosure, and such modifications are intended to fall within the appended claims.

The invention claimed is:

1. An unmanned aerial vehicle mountable to one or more aerial conductors of an electricity transmission line to monitor a component thereof, the unmanned aerial vehicle comprising:

a body having a propulsion system to lift the vehicle, to navigate the vehicle, and to land the vehicle onto one of the aerial conductors of the electricity transmission line;

a component monitoring tool mounted to the body and vertically displaceable between a first position and a second position, the vehicle resting on said aerial conductor in the first and second positions, the tool in the first position being vertically spaced above the component, the tool displacing vertically from the first position above the component toward the second position while the vehicle rests on said aerial conductor, the tool in the second position being engaged with the component; and a displacement assembly mounted to at least one of the body and the tool and comprising at least one displacement member in contact with said aerial conductor upon the vehicle being landed thereon, the at least one displacement member configured to displace the body and the tool along said aerial conductor.

2. The unmanned aerial vehicle as defined in claim 1, wherein the component monitoring tool is vertically displaceable with the body between the first and second positions.

3. The unmanned aerial vehicle as defined in claim 1 or 2, wherein the displacement assembly is mounted to the body, the at least one displacement member being suspended from the body and being vertically displaceable relative thereto.

4. The unmanned aerial vehicle as defined in claim 3, wherein the at least one displacement member is spaced from the body in the first position, and the at least one displacement member is in proximity to the body in the second position.

5. The unmanned aerial vehicle as defined in claim 4, wherein the body has a motor coupled to the at least one displacement member, the motor being operable to drive the at least one displacement member between the first and second positions.

6. The unmanned aerial vehicle as defined in claim 1 or 2, wherein the at least one displacement member in the second position is disengaged from said aerial conductor upon the tool being in the second position and engaged with the component.

7. The unmanned aerial vehicle as defined in claim 1, wherein the component monitoring tool is vertically displaceable with respect to the body between the first and second positions.

8. The unmanned aerial vehicle as defined in claim 7, wherein the displacement assembly is mounted to the tool and the at least one displacement member is fixedly mounted to the tool to be vertically displaced therewith.

9. The unmanned aerial vehicle as defined in claim 8, wherein the at least one displacement member mounted to the tool is operable to displace the body and the tool along said aerial conductor upon the tool being in the second position and engaged to the component.

10. The unmanned aerial vehicle as defined in claim 1 or 2, wherein the at least one displacement member includes two wheels mounted to the body and spaced apart from one another along a length of the body, each wheel being independently vertically displaceable.

11. A method of positioning an unmanned aerial vehicle relative to a component of an aerial conductor of an electricity transmission line, the method comprising:

landing the unmanned aerial vehicle onto the conductor, the unmanned aerial vehicle having a component monitoring tool mounted thereto;

displacing the unmanned aerial vehicle along the conductor while maintaining contact with the conductor until the tool is disposed in proximity to the component; and lowering the tool toward the component to engage the component with the tool while the vehicle is positioned on the conductor.

12. The method as defined in claim 11, further comprising raising the tool above the component after engaging the component with the tool, and displacing the unmanned aerial vehicle along the conductor.

13. The method as defined in claim 11 or 12, wherein lowering the tool includes simultaneously lowering the unmanned aerial vehicle and the tool toward the component.

14. The method as defined in claim 11 or 12, wherein lowering the tool includes lowering the tool with respect to a remainder of the unmanned aerial vehicle.

15. The method as defined in claim 11 or 12, wherein lowering the tool includes lowering only the tool and maintaining a remainder of the unmanned aerial vehicle stationary.

16. The method as defined in claim 11 or 12, wherein lowering the tool includes supporting the unmanned aerial vehicle with the tool engaged with the component.

17. An unmanned aerial vehicle mountable to an aerial conductor of an electricity transmission line to monitor a component thereof, the unmanned aerial vehicle comprising:

a body having a propulsion system to navigate the vehicle and to land the vehicle onto the aerial conductor; and a component monitoring tool mounted to the body and vertically displaceable between a first position and a second position, the tool in the first position being vertically spaced above the component, the tool in the second position being engaged with the component, the tool displacing vertically from the first position above the component toward the second position while the vehicle is landed on the aerial conductor.

18. The unmanned aerial vehicle as defined in claim 17, wherein the component monitoring tool is vertically displaceable with the body between the first and second positions.

19. The unmanned aerial vehicle as defined in claim 17, further comprising a displacement assembly mounted to at least one of the body and the tool and comprising at least one displacement member to displace the body and the tool along the conductor.

20. The unmanned aerial vehicle as defined in claim 19, wherein the displacement assembly is mounted to the body, the at least one displacement member being suspended from the body and being vertically displaceable relative thereto.

* * * * *